(12) United States Patent
Kim et al.

(10) Patent No.: US 9,347,977 B2
(45) Date of Patent: May 24, 2016

(54) CONNECTION ERROR DETECTING APPARATUS AND METHOD WHICH DETECT A CONNECTION ERROR IN A SMART METER

(75) Inventors: Sang-Jun Kim, Seoul (KR); Tae-Hyo Kim, Seoul (KR); Woo-Yong Kim, Seoul (KR); Sang-Suh Park, Gyeonggi-do (KR); Sung-Min Kim, Seoul (KR)

(73) Assignee: KOREA ELECTRIC POWER CORPORATION, Seoul (KR)

( * ) Notice: Subject to any disclaimer, the term of this patent is extended or adjusted under 35 U.S.C. 154(b) by 281 days.

(21) Appl. No.: 14/239,130

(22) PCT Filed: Aug. 17, 2011

(86) PCT No.: PCT/KR2011/006036
§ 371 (c)(1),
(2), (4) Date: Feb. 14, 2014

(87) PCT Pub. No.: WO2013/024919
PCT Pub. Date: Feb. 21, 2013

(65) Prior Publication Data
US 2014/0197966 A1 Jul. 17, 2014

(30) Foreign Application Priority Data
Aug. 16, 2011 (KR) .......................... 10-2011-0081194

(51) Int. Cl.
*G08C 19/16* (2006.01)
*G01R 22/06* (2006.01)
(Continued)

(52) U.S. Cl.
CPC ............... *G01R 22/06* (2013.01); *G01R 31/041* (2013.01); *G01D 4/004* (2013.01); *G01R 22/10* (2013.01); *Y02B 90/242* (2013.01); *Y04S 20/322* (2013.01)

(58) Field of Classification Search
USPC ...................................................... 340/870.25
See application file for complete search history.

(56) References Cited

U.S. PATENT DOCUMENTS 4,255,707 A * 3/1981 Miller .................. G01R 21/133
324/142
5,469,049 A * 11/1995 Briese .................... G01R 35/04
324/130

(Continued)

FOREIGN PATENT DOCUMENTS

EP          0 887 650 A1    12/1998
KR       1020050041557 A     5/2005
(Continued)

OTHER PUBLICATIONS

Extended European Search Report issued in corresponding European Patent Application No. 11871088.8, mailed on Feb. 25, 2015; 4 pages in English language.

*Primary Examiner* — Naomi Small
(74) *Attorney, Agent, or Firm* — McDermott Will & Emery LLP

(57) ABSTRACT

Provided are a connection error detecting apparatus and method. The connection error detecting apparatus, which detects connection errors for each rating of a smart meter, comprises: a parameter calculating unit for calculating connection error detecting parameters including an actual three-phase voltage value, an actual three-phase current value, an effective amount of three-phase power, and an ineffective amount of three-phase power; and a connection error determining unit for setting connection error criteria for detecting connection errors for each rating of the smart meter, and detecting the connection errors for each rating by determining whether or not any one of the connection error detecting parameters satisfies the connection error criteria.

20 Claims, 9 Drawing Sheets

(51) Int. Cl.
*G01R 31/04* (2006.01)
*G01D 4/00* (2006.01)
*G01R 22/10* (2006.01)

(56) References Cited

U.S. PATENT DOCUMENTS

| | | | | |
|---|---|---|---|---|
| 6,038,516 | A * | 3/2000 | Alexander | H02H 3/04 |
| | | | | 702/67 |
| 6,043,642 | A * | 3/2000 | Martin | G01R 22/00 |
| | | | | 324/103 R |
| 6,236,197 | B1 * | 5/2001 | Holdsclaw | G01R 22/066 |
| | | | | 324/110 |
| 9,110,110 | B2 * | 8/2015 | Shin | G01R 21/1331 |
| 2005/0240362 | A1 * | 10/2005 | Randall | G01R 35/04 |
| | | | | 702/61 |
| 2006/0091877 | A1 * | 5/2006 | Robinson | G01R 21/133 |
| | | | | 324/76.11 |
| 2007/0007968 | A1 * | 1/2007 | Mauney, Jr. | G01R 19/2513 |
| | | | | 324/538 |
| 2008/0172192 | A1 * | 7/2008 | Banhegyesi | G01R 22/10 |
| | | | | 702/61 |
| 2009/0287428 | A1 * | 11/2009 | Holdsclaw | G01R 19/2509 |
| | | | | 702/57 |
| 2011/0153244 | A1 * | 6/2011 | Rocha Alves, Jr. | G01R 19/2513 |
| | | | | 702/64 |
| 2012/0086436 | A1 * | 4/2012 | Holdsclaw | G01R 19/2513 |
| | | | | 324/140 R |

FOREIGN PATENT DOCUMENTS

| | | |
|---|---|---|
| KR | 1020090082670 A | 7/2009 |
| KR | 1020100048736 A | 5/2010 |
| KR | 1020110006992 A | 1/2011 |

* cited by examiner

US 9,347,977 B2

CONNECTION ERROR DETECTING APPARATUS AND METHOD WHICH DETECT A CONNECTION ERROR IN A SMART METER

RELATED APPLICATIONS

This application is the U.S. National Phase under 35 U.S.C. §371 of International Application No. PCT/KR2011/006036, filed on Aug. 17, 2011, which in turn claims the benefit of Korean Application No. 10-2011-0081194, filed on Aug. 16, 2011, the disclosures of which Applications are incorporated by reference herein.

TECHNICAL FIELD

The present invention relates to a connection error detection device and method for detecting a connection error in a smart meter and, more particularly, to a connection error detection device and method for detecting a connection error for each rating in a smart meter using an active energy value, a reactive energy value, a voltage root-mean-square (RMS) value and a current RMS value for each phase, which are basically calculated in the smart meter.

BACKGROUND ART

Currently, the installation of all smart meters is manually performed by workers in the field. In this case, smart meters are electronic watt-hour meters that are capable of checking the amounts of power used for each time period in real time and performing two-way communication with a power provider. Since smart meters are manually installed, there are many cases where normal connection is not achieved and a connection error occurs due to the carelessness of a worker, distraction attributable to the difficult environment of a site where a smart meter is located, or the like. In particular, a possibility that a connection error occurs in a three-phase four-wire smart meter installed for a customer who uses relatively higher power is much higher than a possibility that a connection error occurs in a single-phase two-wire smart meter.

Because of connection errors, "insufficient measurement," "excessive measurement," and "zero measurement" in which a measured value is zero occur. "Insufficient measurement" or "zero measurement" causes a serious loss from the point of view of a power provider, and "excessive measurement" causes a serious loss from the point of view of a customer.

To prevent such a connection error, a connection error has been detected using the phase values of voltage and current. However, to detect a connection error using phase values, there is inconvenience in which the zero crossing of voltage and current alternating current waveforms should be implemented.

Furthermore, in the case of a smart meter in which a analog block (an ADC converter) and a digital block (a DSP or an MCU) have been implemented in one chip, if separate zero crossing is not implemented, the phase difference between voltage and current is obtained using active and reactive energy values calculated for a specific period and then a connection error is determined. Accordingly, it is difficult to determine the time at which the phase difference used to determine a connection error is calculated, and thus a problem arises in that the accuracy of the determination of a connection error is low.

DISCLOSURE

Technical Problem

An object of the present invention is to provide a connection error detection device and method for determining whether a connection error for each rating has occurred in a smart meter using an active energy value, a reactive energy value, a voltage RMS value and a current RMS value for each phase, which are basically calculated in the smart meter.

Technical Solution

In order to accomplish the above object, in accordance with an aspect of the present invention, there is provided a connection error detection device for detecting a connection error for each rating in a smart meter, including a parameter calculation unit configured to calculate connection error detection parameters including voltage root-mean-square (RMS) values, current RMS values, active energy values and reactive energy values for three phases; and a connection error determination unit configured to set a connection error detection criterion for detecting a connection error for each rating in the smart meter, and to detect the connection error for each rating by determining whether any one of the connection error detection parameters meets the connection error detection criterion, wherein the connection error detection criterion is set to any one of a case where active energy values for any one or more phases are measured in a negative direction, a case where a voltage RMS value for any one phase is a first percentage or less or a second percentage or more of an average rated voltage for remaining two phases, the second percentage being higher than the first percentage, and a case where active and reactive energy values for any one or more phases are all measured in a positive direction.

The connection error determination unit, for a single-phase two-wire smart meter, may set any one of a case where the active energy values for any one or more phases are measured in a negative direction, and a case where the voltage RMS value is zero or the first percentage or less as the connection error detection criterion.

The connection error determination unit, for a three-phase four-wire smart meter having no capacitor, may set any one of a case where the active energy values for any one or more phases are measured in a negative direction, a case where the voltage RMS value for any one phase is the first percentage or less or the second percentage or more of the average rated voltage for the two phases, and a case where the active and reactive energy values for any one or more phases are all measured in a positive direction as the connection error detection criterion.

The connection error determination unit, for a three-phase four-wire smart meter having a capacitor, may set any one of a case where the active energy values for any one or more phases are measured in a negative direction, and a case where the voltage RMS value for any one phase is the first percentage or less or the second percentage or more of the average rated voltage for the two phases as the connection error detection criterion.

If phase differences between voltage and current for any one or more phases are 120°, 180° or 240°, the active energy values may be measured in a negative direction.

If the phase differences between voltage and current for any one or more phases are 240° or more because of a connection error, the reactive energy values may be always integrated in a positive direction, and the connection error determination unit, in order to detect a connection error if the phase differences between voltage and current are 240° or more, may set the reactive energy values integrated in the positive direction as the connection error detection criterion.

The connection error determination unit, if phase voltages for any one or more phases are generated as a line voltage that is not a first voltage and is a second voltage higher than the first voltage, may set the line voltage as the connection error detection criterion.

The connection error determination unit, in order to detect a connection error in a case where although the connection error would be detected because a phase difference between voltage and current for any one phase is 120° because of the connection error, the active energy value is normally measured in a positive direction because of excessive compensation for a power factor, may set a case where the current RMS value is 10% or more of a rated current and the active energy values are measured in a negative direction as the connection error detection criterion.

The first percentage may be 50%, and the second percentage may be 150%.

The connection error detection device may further include a voltage measurement unit configured to measure the voltage values for three phases; a current measurement unit configured to measure the current values for three phases; a display unit configured to receive a connection error indication message from the connection error determination unit, and to display the connection error; and an alarm unit configured to receive a connection error alarm message from the connection error determination unit, and to provide notification of occurrence of the connection error.

The parameter calculation unit may calculate a voltage RMS value for the voltage value for each of the phases, and may calculate a current RMS value for the current value for each of the phases.

In order to accomplish the above object, in accordance with another aspect of the present invention, there is provided a connection error detection method for detecting a connection error for each rating in a smart meter using a connection error detection device, the connection error detection device including a voltage measurement unit configured to measure voltage values for three phases, a current measurement unit configured to measure current values for three phases, a parameter calculation unit configured to calculate parameters used to detect a connection error in a smart meter, and a connection error determination unit configured to detect the connection error using the parameters, the method including receiving, by the parameter calculation unit, the voltage and current values for three-phase from the voltage and current measurement units, and calculating, by the parameter calculation unit, a voltage RMS value and a current RMS value for each of the phases; calculating, by the parameter calculation unit, an active energy value and a reactive energy value using the voltage and current RMS values for each of the phases; setting, by the connection error determination unit, a criterion for detecting the connection error for each rating in the smart meter to any one of a case where active energy values for any one or more phases are measured in a negative direction, a case where a voltage RMS value for any one phase is a first percentage or less or a second percentage or more of an average rated voltage for remaining two phases, the second percentage being higher than the first percentage, and a case where active energy values and reactive energy values for any one or more phases are all measured in a positive direction; and detecting, by the connection error determination unit, the connection error for each rating by determining whether any one of the connection error detection parameters meets the connection error detection criterion.

Setting the criterion as any one of the cases may include, if the smart meter is the a single-phase two-wire smart meter, setting, by the connection error determination unit, a case where the active energy values for any one or more phases are measured in a negative direction, as the connection error detection criterion; and setting, by the connection error determination unit, a case where the voltage RMS value is zero or the first percentage or less as the connection error detection criterion.

Setting the criterion as any one of the cases may include, if the smart meter is a three-phase four-wire smart meter having no capacitor, setting, by the connection error determination unit, a case where the active energy values for any one or more phases are measured in a negative direction as the connection error detection criterion; setting, by the connection error determination unit, a case where the voltage RMS value for any one phase is the first percentage or less or the second percentage or more of the average rated voltage for the two phases as the connection error detection criterion; and setting, by the connection error determination unit, a case where the active and reactive energy values for any one or more phases are all measured in a positive direction as the connection error detection criterion.

Setting the criterion as any one of the cases may include, if the smart meter is a three-phase four-wire smart meter having a capacitor, setting, by the connection error determination unit, a case where the active energy values for any one or more phases are measured in a negative direction as the connection error detection criterion; and setting, by the connection error determination unit, a case where the voltage RMS value for any one phase is the first percentage or less or the second percentage or more of the average rated voltage for the two phases as the connection error detection criterion.

If phase differences between voltage and current for any one or more phases are 120°, 180° or 240°, the active energy values may be measured in a negative direction.

Setting the criterion as any one of the cases may include, in order to detect a connection error if the phase differences between voltage and current for any one or more phases are 240° or more, setting, by the connection error determination unit, the reactive energy values integrated in the positive direction as the connection error detection criterion.

Setting the criterion as any one of the cases may include determining, by the connection error determination unit, whether phase voltages for any one or more phases are generated as a line voltage that is not a first voltage and is a second voltage higher than the first voltage; and setting, by the connection error determination unit, the line voltage as the connection error detection criterion.

Setting the criterion as any one of the cases may include, in order to detect a connection error in a case where although the connection error would be detected because a phase difference between voltage and current for any one phase is 120° because of the connection error, the active energy value is normally measured in a positive direction because of excessive compensation for a power factor, setting, by the connection error determination unit, a case where the current RMS value is 10% or more of a rated current and the active energy values are measured in a negative direction as the connection error detection criterion.

The first percentage may be 50%, and the second percentage may be 150%.

The connection error detection method may further include displaying the detected connection error for each rating via a display unit of the connection error detection device; and providing notification that the detected connection error for each rating has occurred via an alarm unit of the connection error detection device.

Advantageous Effects

The embodiments of the present invention are configured to detect a connection error, which may occur in various manners, for each rated smart meter, such as a single-phase two-wire smart meter or a three-phase four-wire smart meter (having a capacitor or no capacitor), using a voltage RMS value, a current RMS value, an active energy value and a reactive energy values for each phase, which are basically calculated in a smart meter. As a result, a conventional phase angle calculation algorithm and related hardware configuration required to calculate a phase angle and detect a connection error may be omitted, and accordingly the cost required to detect a connection error may be reduced.

Furthermore, the embodiments of the present invention are configured to prevent the error of a worker when a smart meter is connected and rapidly deal with a connection error or failure when the connection error or failure occurs. As a result, complaints attributable to erroneous measurement or zero measurement may be prevented from occurring, and the manpower and business of employees in charge of measurement related to the sale of electric power may be prevented from being unnecessarily consumed because of power charge disputes. Furthermore, the problem in which appropriate power charges are not received when the power charges are calculated based on power charge agreement may be improved.

BEST MODE

Figure 1:
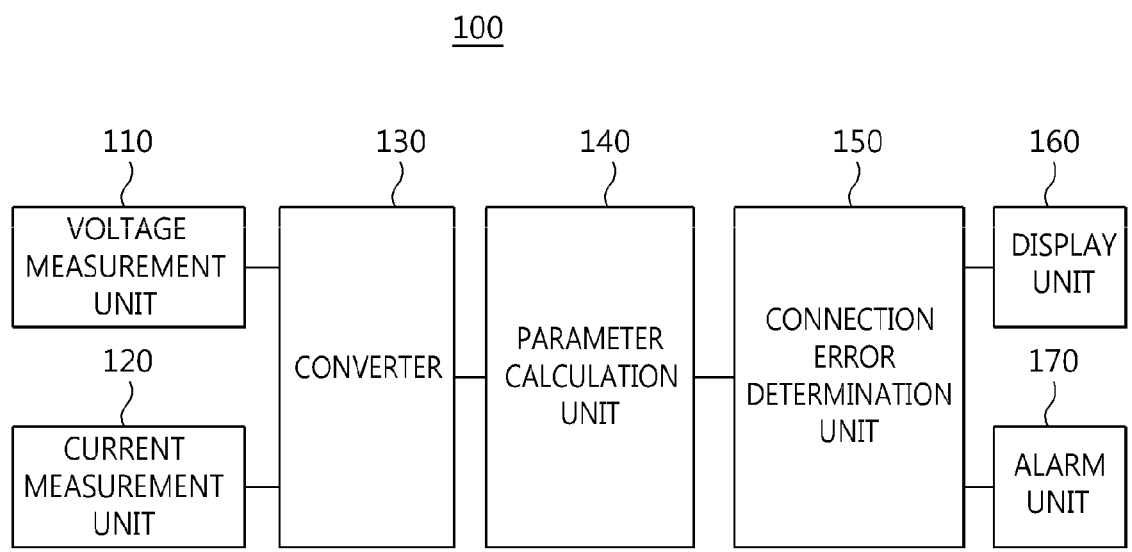
FIG. 1 is a diagram schematically illustrating a connection error detection device according to an embodiment of the present invention.

The present invention will be described in detail below with reference to the accompanying drawings. In the following description, repeated descriptions and detailed descriptions of known functions and configurations which have been deemed to make the gist of the present invention unnecessarily obscure will be omitted. Embodiments of the present invention are provided to fully describe the present invention to a person having ordinary knowledge in the art to which the present invention pertains. Accordingly, the shapes, sizes, etc. of components in the drawings may be exaggerated to make the description clearer.

Figure 2:
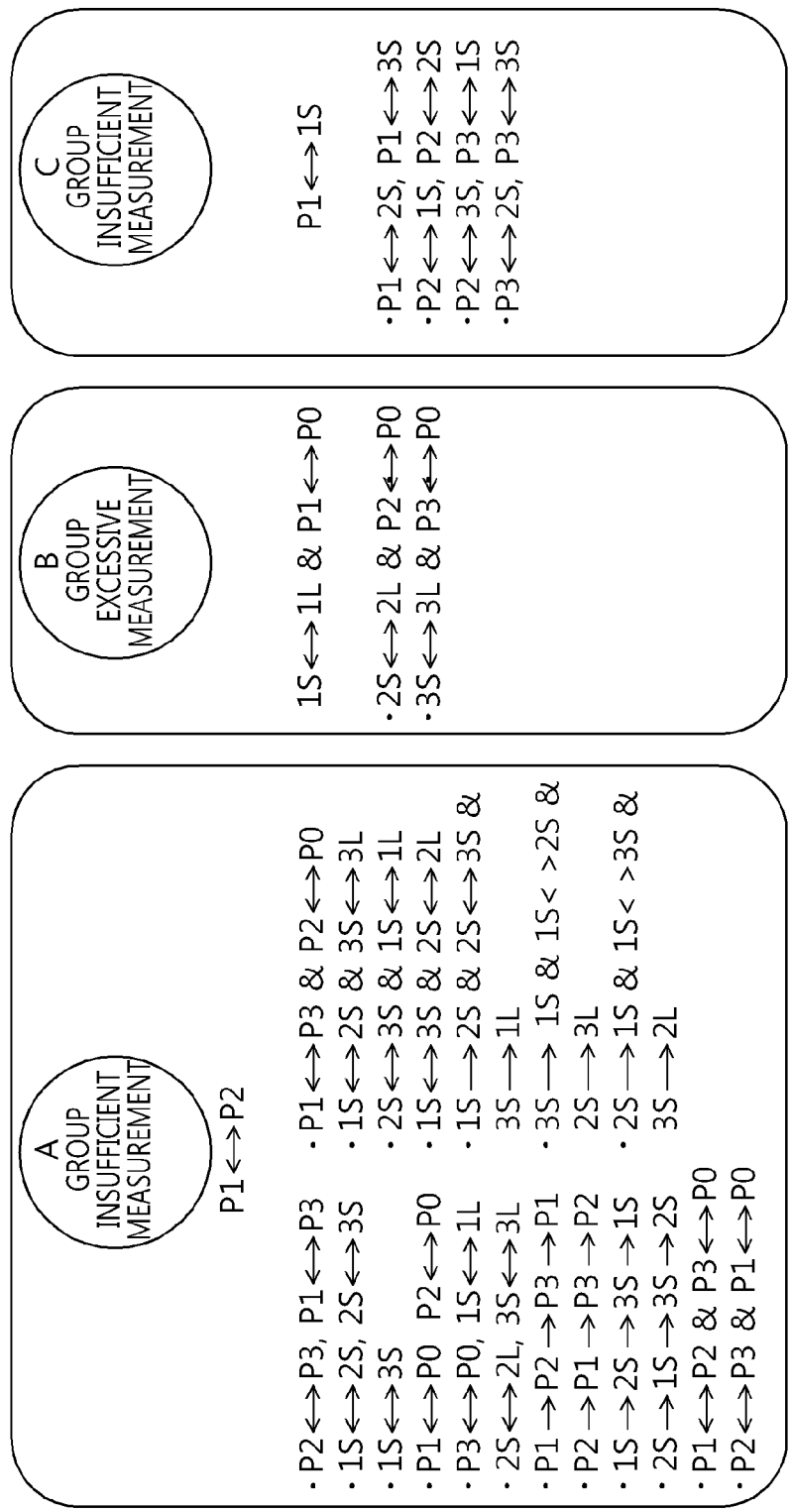
FIG. 2 is a diagram illustrating connection error type groups that may occur in three phases according to an embodiment of the present invention.

FIG. 1 is a diagram schematically illustrating a connection error detection device according to an embodiment of the present invention. FIG. 2 is a diagram illustrating connection error type groups that may occur in three phases according to an embodiment of the present invention.

As illustrated in FIG. 1, an connection error detection device 100 according to an embodiment of the present invention, if respective connection error types that occur in phases A, B and C are classified into groups A, B and C, as illustrated in FIG. 2, detects a connection error in a smart meter for each rating using a voltage RMS value, a current RMS value, an active energy value and a reactive energy value calculated for each phase. In this case, the smart meter is an electronic watt-hour meter that is capable of checking the amount of power used for each time period in real time and performing two-way communication with a power provider.

The connection error detection device 100 includes a voltage measurement unit 110, a current measurement unit 120, a converter 130, a parameter calculation unit 140, a connection error determination unit 150, a display unit 160, and an alarm unit 170.

The voltage measurement unit 110 measures voltage values Va, Vb and Vc for respective phases A, B and C. Furthermore, the voltage measurement unit 110 transfers the voltage values Va, Vb and Vc for respective phases to the converter 130.

The current measurement unit 120 measures current values Ia, Ib and Ic for respective phases A, B and C. Furthermore, the voltage measurement unit 110 transfers the current values Ia, Ib and Ic for respective phases to the converter 130.

The converter 130 converts the voltage values Va, Vb and Vc for respective phases transferred from the voltage measurement unit 110 into digital signals, and transfers the digital signals to the parameter calculation unit 140. The converter 130 converts the current values Ia, Ib and Ic for respective phases transferred from the current measurement unit 120 into digital signals, and transfers the digital signals to the parameter calculation unit 140.

The parameter calculation unit 140 receives the voltage and current values for respective phases, which have been converted into the digital signals, from the converter 130. The parameter calculation unit 140 calculates respective voltage RMS values for the voltage values for respective phases. The parameter calculation unit 140 calculates respective current RMS values for the current values for respective phases. Furthermore, the parameter calculation unit 140 calculates active energy values in power transmission and reception directions using the voltage and current RMS values for respective phases. The parameter calculation unit 140 calculates lagging and leading reactive energy values in power transmission and reception directions based on the calculated active energy values.

The connection error determination unit 150 receives, from the parameter calculation unit 140, connection error detection parameters including the voltage RMS values for the voltage values for respective phases, the current RMS values for the current values for respective phases, the active energy values in power transmission and reception directions, the lagging and leading reactive energy values in power transmission and reception directions based on the active energy values. The connection error determination unit 150 detects a connection error by determining whether one of the received connection error detection parameters meets a connection error detection criterion. Connection error detection criteria according to an embodiment of the present invention are set as follows:

1) Single-Phase Two-Wire Smart Meter (in the Case of a One-Way Customer)

The connection error determination unit 150 sets a case where in any one or more devices, an active energy value in a power transmission direction is smaller than "0," or a voltage RMS value is zero (is not measured) or is equal to or smaller than "50%" of a rated voltage as a connection error detection criterion for a "single-phase two-wire smart meter."

Furthermore, the connection error determination unit 150 determines that a connection error has occurred in a corresponding smart meter if a connection error detection parameter calculated in a "single-phase two-wire smart meter" meets the connection error detection criterion.

2) Three-Phase Four-Wire Smart Meter (Having No Capacitor)

①The connection error determination unit 150 sets a case where an active energy value for each phase is smaller than "0," or a case where an open-phase voltage situation in which a voltage RMS value for any one phase is "150%" or more or "50%" or less of an average rated voltage for any two phases has occurred as a connection error detection criterion for a "three-phase four-wire smart meter" having no capacitor.

②The connection error determination unit 150 sets a case where an active energy value for each phase is larger than "0" and a reactive energy value is larger than "0," that is, a case where reactive energy values are integrated only in a leading phase (a first quadrant), as a connection error detection criterion for a "three-phase four-wire smart meter" having no capacitor.

The connection error determination unit 150 determines that a connection error has occurred in a corresponding smart meter if a connection error detection parameter calculated in the "three-phase four-wire smart meter" meets the connection error detection criterion ① or ②.

3) Three-Phase Four-Wire Smart Meter (Having a Capacitor in Order to Compensate for a Power Factor)

The connection error determination unit 150 sets a case where an active energy value for each phase is smaller than "0," or a case where an open-phase voltage situation in which a voltage RMS value for any one phase is "150%" or more or "50%" or less of an average rated voltage for any two phases has occurred as a connection error detection criterion for a "three-phase four-wire smart meter" having a capacitor.

Furthermore, the connection error determination unit 150 determines that a connection error has occurred in a corresponding smart meter if a connection error detection parameter calculated in the "three-phase four-wire smart meter" meets the connection error detection criterion.

Meanwhile, if a connection error has occurred, the connection error determination unit 150 generates a connection error indication message adapted to provide notification of the detection of the connection error, and then transfers the connection error indication message to the display unit 160. Furthermore, the connection error determination unit 150 generates a connection error alarm message adapted to generate an alarm and then transfers the connection error alarm message to the alarm unit 170.

The display unit 160 includes a component capable of displaying information, such as an LCD (not illustrated), and displays a connection error for each rating in a smart meter when the connection error indication message is received from the connection error determination unit 150. For example, the display unit 160 displays the energy, cumulative energy, power factor value, etc. of the smart meter.

The alarm unit 170 includes a component capable of generating an alarm, such as a speaker (not illustrated), and provides notification that a connection error has occurred in the smart meter when the connection error alarm message is received from the connection error determination unit 150.

Next, an example of detecting a connection error for each of groups A, B and C in a smart meter in a connection error detection device according to an embodiment of the present invention will be described with reference to FIGS. 3 to 6.

Figure 3:
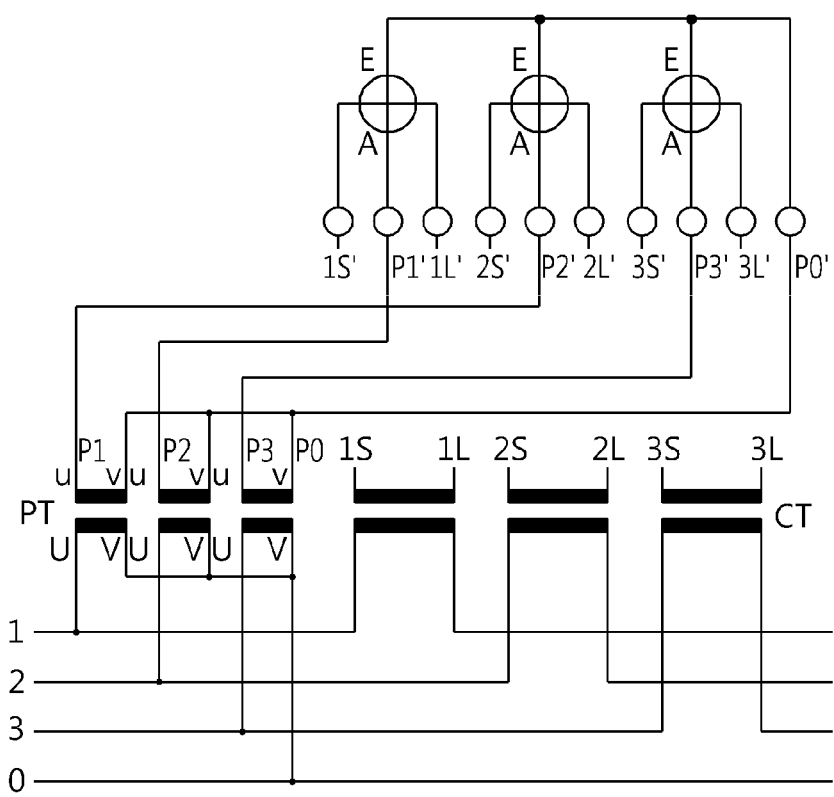
FIGS. 3 and 4 are diagrams illustrating an example of an erroneous connection diagram of a three-phase four-wire smart meter for group A and examples of vector diagrams for respective phases according to an embodiment of the present invention.
Figure 4:
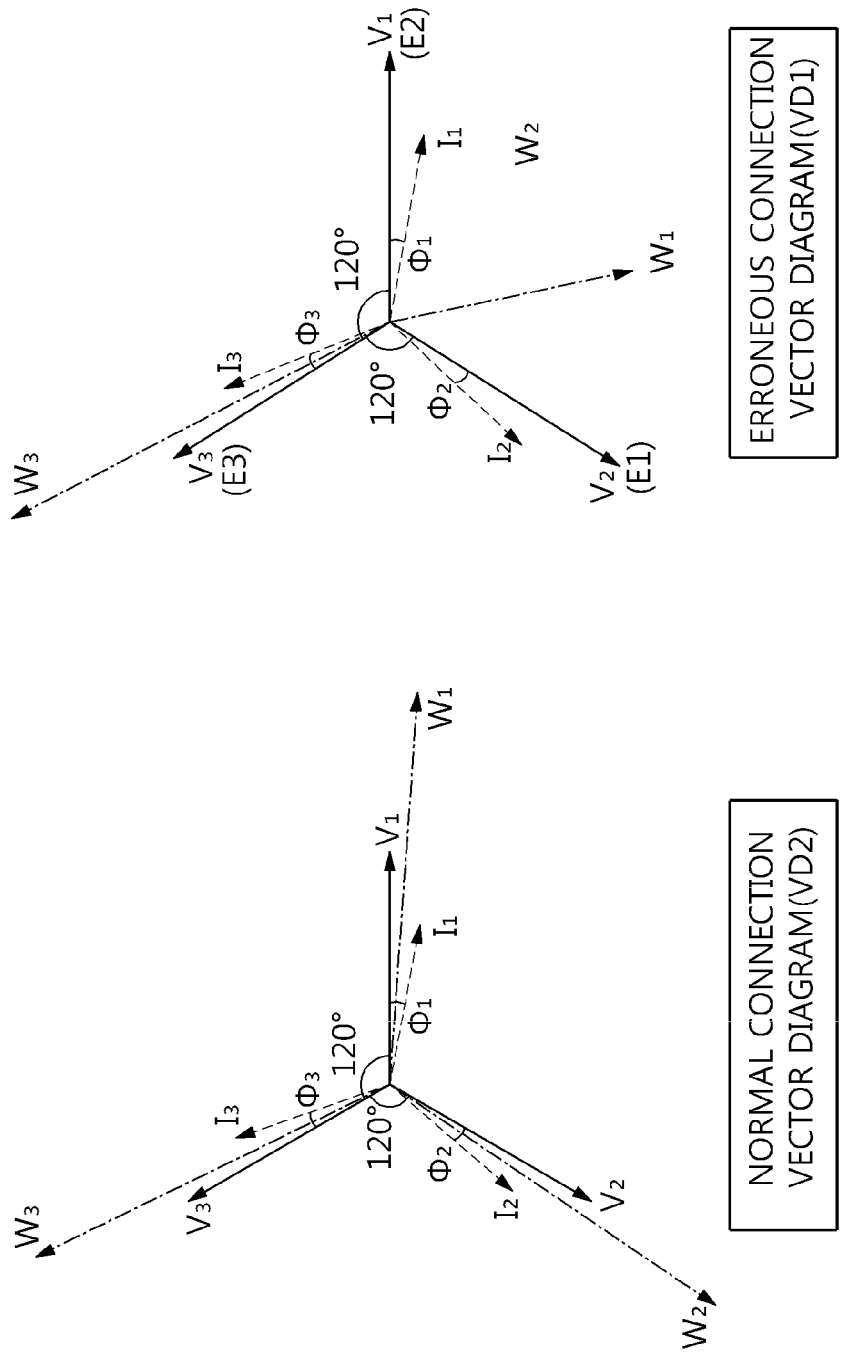

FIG. 3 is a diagram illustrating an example of an erroneous connection diagram for group A in a three-phase four-wire smart meter according to an embodiment of the present invention, and FIG. 4 is a diagram illustrating the normal measurement of the three-phase four-wire smart meter illustrated in FIG. 3 and a vector diagram for respective phases in which P1 and P1' are cross-connected with P2 and P2'.

Referring to FIG. 3, when the three-phase four-wire smart meter is normally connected, terminal P1 is connected to terminal P1', and the terminal P2 is connected to terminal P2'. However, a connection error for group A in which the terminal P1 is connected to the terminal P2' and terminal P2 is connected to terminal P1' may occurs. A method of detecting a connection error in this case will now be described.

More specifically, when the terminal P1 and the terminal P1' are cross-connected with the terminal P2 and the terminal P2', voltage E2 ($=V_2$) is applied to an active energy value $W_1$ in phase A of an erroneous connection vector diagram VD1, voltage E1 ($=V_1$) is applied to an active energy value W2 in phase B, and voltage E3 ($=V3$) is applied to an active energy value $W_3$ in phase C, as illustrated in FIG. 4.

In other words, voltage $V_2$ ($=$E2), rather than voltage $V_1$ applied in a normal connection vector diagram VD2, is applied to the active energy value $W_1$ in phase A of the erroneous connection vector diagram VD1, and thus the active energy value $W_1$ is measured as $W_1 = E2 \cdot I_1 \cdot COS\ \theta_1 = E2 \cdot I_1 \cdot COS(240 + \phi)$.

Then, if the power factor is 1 in phase A, the active energy value is measured in a [−] power transmission direction. If the phase difference $\theta_1$ between voltage and current is within the range of 0 to below 30°, the active energy value is measured in the [−] power transmission direction, and the reactive energy value is measured in a [+] power transmission direction. If the phase difference $\theta_1$ between voltage and current is 30°, the active energy value is not measured, and a reactive energy value is measured in a [+] power transmission direction. If the phase difference $\theta_1$ between voltage and current is in the range between 30 and 90°, the active energy value is measured in a [+] power transmission direction, and the reactive energy value is measured in a [+] power transmission direction. If the phase difference $\theta_1$ between voltage and current is in the range of −1 to above −60°, the active energy value is measured in the [−] power transmission direction, and the reactive energy value is measured in a [+] power transmission direction. If the phase difference $\theta_1$ between voltage and current is in the range of −60 to above −90°, the active energy value is measured in the [−] power transmission direction, and the reactive energy value is measured in the [−] power transmission direction.

Furthermore, voltage $V_1$ ($=$E1), rather than voltage $V_2$ applied in the normal connection vector diagram VD2, is applied to the active energy value $W_2$ in phase B of the erroneous connection vector diagram VD1, the active energy value $W_2$ is measured as $E1 \cdot I_2 \cdot COS\ \theta_2 = E1 \cdot I_2 \cdot COS(120 + \phi)$.

Then, if the power factor is 1 in phase B, the active energy value W2 is measured in the [−] power transmission direction. If the phase difference θ1 between voltage and current is in the range of 0 to 60°, the active energy value is measured in the [−] power transmission direction, and the reactive energy value is measured in the [−] power transmission direction. If the phase difference θ1 between voltage and current is in the range of above 60 to 90°, the active energy value is measured in the [−] power transmission direction, and the reactive energy value is measured in a [+] power transmission direction. If the phase difference θ1 between voltage and current is in the range of −1 to above −30°, the active energy value is measured in the [−] power transmission direction, and the reactive energy value is measured in the [−] power transmission direction. If the phase difference θ1 between voltage and current is −30°, the active energy value is not measured, and the reactive energy value is measured in the [−] power transmission direction.

Finally, in the erroneous connection vector diagram VD1 and the normal connection vector diagram VD2, phase C is normally measured and voltage $V_3$ is applied, and thus the active energy value $W_3$ is measured as $E3 \cdot I_3 \cdot COS\, θ_3 = E3 \cdot I_3 \cdot COS\, φ$.

As a result, in the case where three-phase combined measurement is carried out ($W_1+W_2+W_3$), a measured value is not obtained if three-phase voltages and currents are balanced ($I_1=I_2=I_3=I$, and $V_1=V_2=V_3=V$), and the active energy value is measured as a [−] or [+] value if the load is not balanced, so that it is difficult to detect whether a connection error has occurred via a three-phase combined measured value. However, via the measured values for respective phases, regardless of the condition of the load, the active energy value is measured in a [−] direction in any phase, and thus it is possible to determine whether a connection error has occurred.

Figure 5:
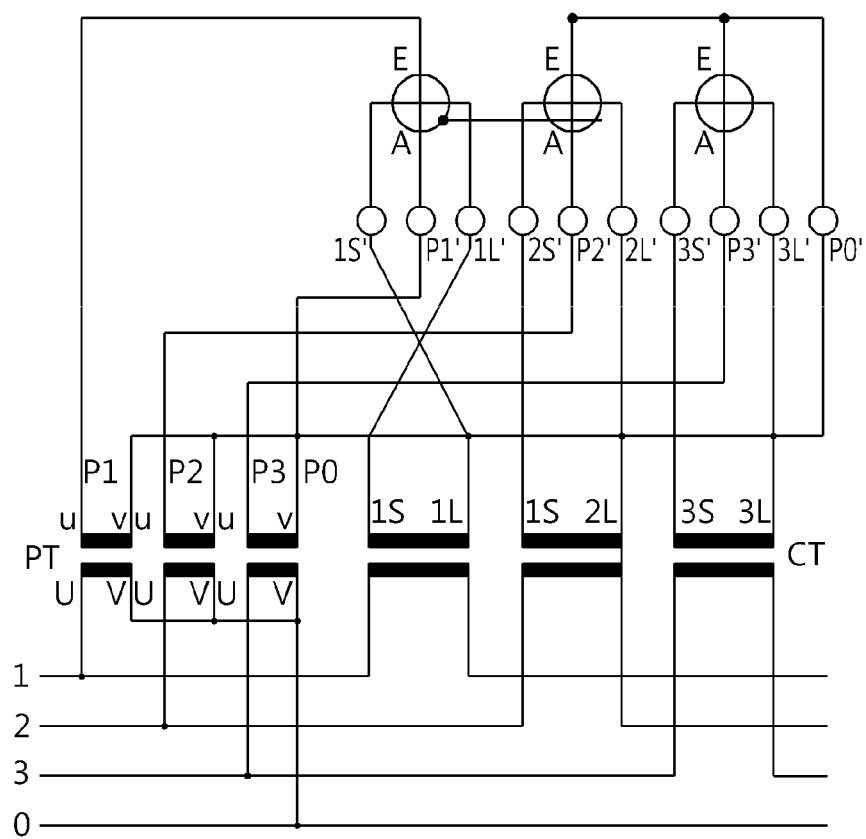
FIGS. 5 and 6 are diagrams illustrating an example of an erroneous connection diagram of a three-phase four-wire smart meter for group B and examples of vector diagrams for respective phases according to an embodiment of the present invention.
Figure 6:
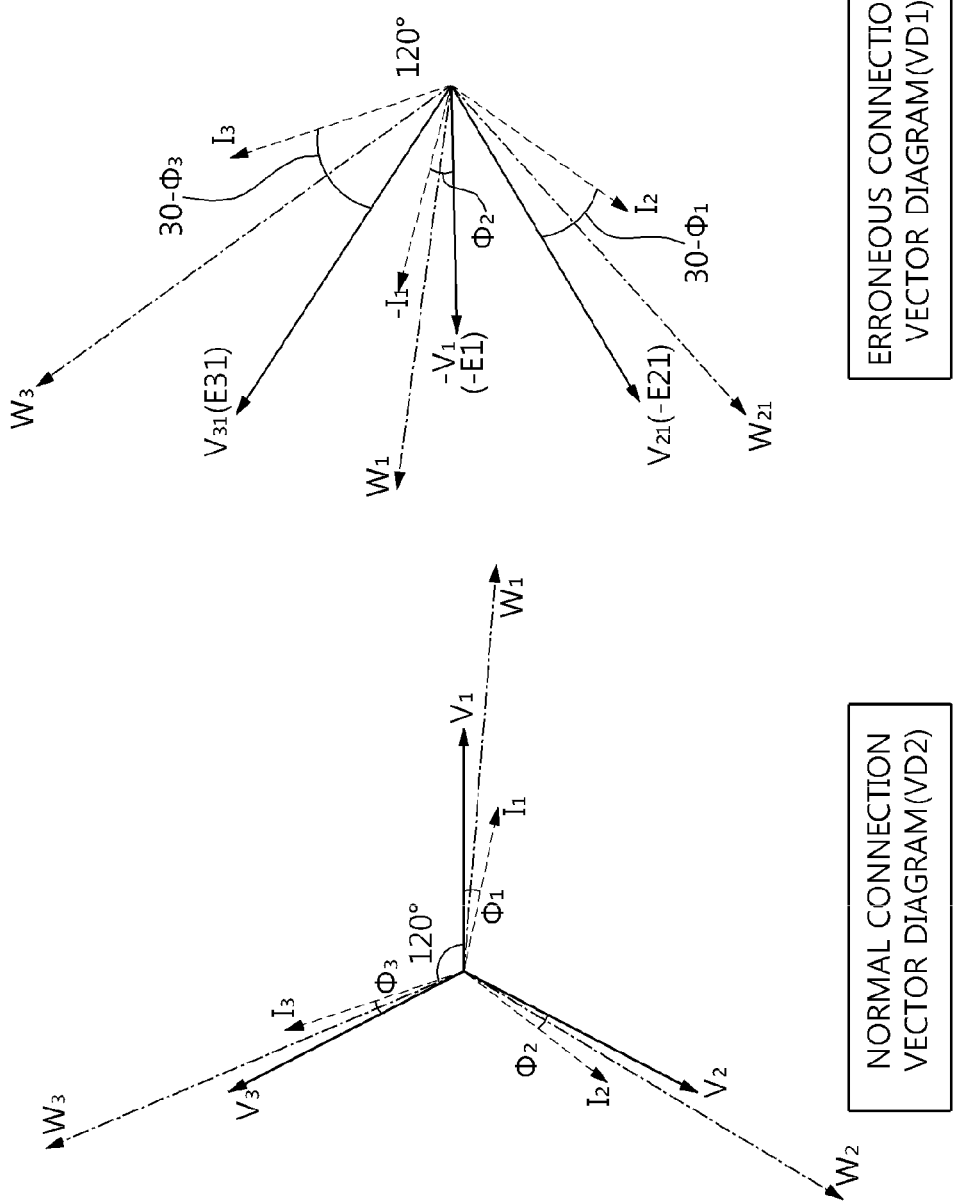

FIG. 5 is a diagram illustrating an example of an erroneous connection diagram for group B in a three-phase four-wire smart meter according to an embodiment of the present invention, and FIG. 6 is a diagram illustrating the normal measurement of the three-phase four-wire smart meter illustrated in FIG. 5 and vector diagrams for respective phases in which 1S and 1S' are cross-connected with 1L and 1L' and P0 and P0' are cross-connected with P1 and P1'.

Referring to FIG. 5, when the three-phase four-wire smart meter is normally connected, the terminal 1S is connected to the terminal 1S' and the terminal 1L is connected to the terminal 1L'. Furthermore, the terminal P0 is connected to the terminal P0', and the terminal P1 is connected to the terminal P1'. However, with regard to group B, a connection error in which the terminal 1S is connected to the terminal 1L' and the terminal 1L is connected to the terminal 1S' and a connection error in which the terminal P0 is connected to the terminal P1' and the terminal P1 is connected to the terminal P0' may occur. A method of detecting a connection error in this case will now be described.

More specifically, when the terminals 1S and 1S' are cross-connected to the terminals 1L and 1L', current $-I_1$ is conducted and voltage $-E1 (=-V_1)$ is applied to an active energy value $W_1$ in phase A of the erroneous connection vector diagram VD1, current $I_2$ is conducted and voltage $E21 (=V_{21})$ is applied to an active energy value $W_2$ in phase B, and current $I_3$ is conducted and voltage $E31 (=V_{31})$ is applied to an active energy value $W_3$ in phase C, as illustrated in FIG. 6.

In other words, in phase A of the erroneous connection vector diagram VD1, voltage $V_1 (=E1)$, rather than voltage $V_1$ applied in a normal connection vector diagram VD2, is applied to the active energy value $W_1$, and thus the active energy value W1 is normally measured as $W_1=E1 \cdot I_1 \cdot COS\, θ_1=E1 \cdot I_1 COS\, φ$.

Furthermore, in phase B of the erroneous connection vector diagram VD1, line voltage $V_{21} (=E21)$, rather than voltage $V_2$ applied in the normal connection vector diagram VD2, is applied to the active energy value $W_2$, and thus the active energy value $W_2$ is measured as $W_2=E21 \cdot I_2 \cdot COS(330+φ)$. Then, when the power factor is 1 in phase B, the active energy value W2 is measured in a [+] power transmission direction. If the phase difference φ between voltage and current is in the range of 0 to below 30°, the active energy value is measured in the [+] power transmission direction, and the reactive energy value is measured in the [+] power transmission direction. If the phase difference φ between voltage and current is 30°, the active energy value is measured in the [+] power transmission direction, and the reactive energy value is not measured. If the phase difference φ between voltage and current is in the range of above 30 and 90°, the active energy value is measured in the [+] power transmission direction, and the reactive energy value is measured in a [−] power transmission direction. If the phase difference φ between voltage and current is in the range of −1 to above −60°, the active energy value is measured in the [+] power transmission direction, and the reactive energy value is measured in the [+] power transmission direction. If the phase difference φ between voltage and current is in a leading phase, that is, in the range of −60 to −90°, the active energy value is measured in the [−] power transmission direction, and the reactive energy value is measured in the [+] power transmission direction.

Finally, in phase C of the erroneous connection vector diagram VD1, line voltage $V_{31} (=E31)$, rather than voltage $V_3$ applied in the normal connection vector diagram VD2, is applied to the active energy value $W_3$, and thus the active energy value $W_3$ is measured as $E31 \cdot I_3 \cdot COS(30+φ)$.

Then, if the phase difference φ between voltage and current is in the range of 0 to below 60° in phase C, the active energy value is measured in the [+] power transmission direction, and the reactive energy value is measured in the [−] power transmission direction. If the phase difference φ between voltage and current is 60°, the active energy value is not measured, and the reactive energy value is measured in the [−] power transmission direction. If the phase difference φ between voltage and current is in the range of a lagging phase, that is, above 60 to 90°, the active energy value is measured in the [−] power transmission direction, and the reactive energy value is measured in the [−] power transmission direction. If the phase difference φ between voltage and current is in the range of −1 to above −30°, the active energy value is measured in the [+] power transmission direction, and the reactive energy value is measured in the [−] power transmission direction. If the phase difference φ between voltage and current is in the range of −30 to above −90°, the active energy value is measured in the [−] power transmission direction, and the reactive energy value is measured in the [+] power transmission direction.

As a result, in the case where three-phase combined measurement is carried out ($W_1+W_2+W_3$), excessive measurement is performed by ⅓ if three-phase voltages and currents are balanced ($I_1=I_2=I_3=I$, and $V_1=V_2=V_3=V$), and the active energy value is measured in the [−] or [+] direction if the load is not balanced. Accordingly, if the power factor is normal, excessive measurement is made, and the active energy values for respective phases are measured in the [+] power transmission direction, so that it is difficult to determine whether a connection error has occurred. However, P0 and P0' are cross-connected with P1 and P1', and thus line voltages $V_{21}$ and $V_{31}$ are generated in the phases B and C (P2 and P2', and P3 and P3'), so that it is possible to detect whether a connection error has occurred.

Figure 7:
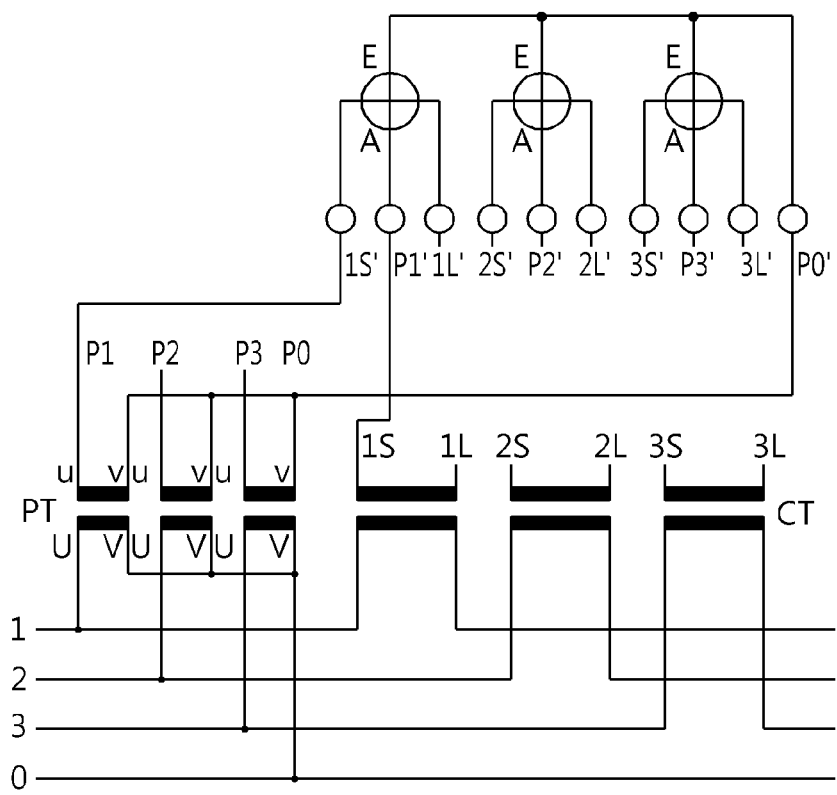
FIG. 7 is a diagram illustrating an example of an erroneous connection diagram of a three-phase four-wire smart meter for group C according to an embodiment of the present invention.

FIG. 7 is a diagram illustrating a case where P1 and 1S are cross-connected in an erroneous connection diagram of a three-phase four-wire smart meter for group C according to an embodiment of the present invention.

Referring to FIG. 7, when a three-phase four-wire smart meter is normally connected, a terminal P1 is connected to a terminal P1', and a terminal 1S and a terminal 1S' are connected. However, in group C, a connection error in which the terminal P1 is connected to the terminal 1S' and the terminal 1S is connected to the terminal P1' may occur. A method of detecting a connection error in this case will now be described.

More specifically, if the terminal P1 is connected to the terminal 1S' and the terminal 1S is interconnected with the terminal P1', voltage P1 becomes no voltage, and thus $W_1 = E1 \cdot I_1 \cdot COS\ \phi = 0$ is not measured. Accordingly, a connection error may be detected using an open-phase voltage situation in which a voltage measured in each phase is compared with the average rated voltage of voltages measured in the remaining two phases. In this case, a voltage smaller than a rated voltage is generated within the rated burden range of a CT, this case is distinguished from an open-phase voltage case that is generated because of no connection between the terminals P1 and P1'. A detailed method of detecting a connection error using an open-phase voltage situation according to an embodiment of the present invention will be described with reference to FIGS. 8 and 9.

Based on the above description, a connection error detection criterion capable of detecting a connection error, that is, common characteristics, which is set by the connection error determination unit 150 according to an embodiment of the present invention is arranged as follows. That is, in the case where when the phase difference between voltage and current is 120°, 180° and/or 240° in one or more phases, the active energy value is measured in the [−] power transmission direction, in the case where a phase voltage in each phase is a line voltage of 190 V, rather than a general voltage of 110 V, or in the case where no voltage or a small voltage is generated, it may be determined that a connection error has occurred.

Furthermore, if a load power factor is always maintained as a lagging power factor (30° to 90°) when the phase difference between voltage and current is equal to or larger than 240° because of a connection error, the active energy value is measured in the [+] power transmission direction, and thus it is difficult to determine a connection error. However, at the same time, the calculated reactive energy value is always measured in the [+] power transmission direction, and thus it may be determined using the reactive energy value whether a connection error has occurred. That is, if the same lagging power factor is maintained upon normal connection, the reactive energy value is always measured in the [−] power transmission direction, and thus a connection error may be detected by determining whether the reactive energy value is always measured in the [+] power transmission direction.

Meanwhile, in addition to the above-described case, a connection error characteristic does not appear in a case where an excessive number of capacitors are installed in order to improve the load power factor of power reception equipment or in a case where compensation is not performed in automatic conjunction with load.

For example, in the case where a difference of 120° or more occurs in any one phase because of a connection error or in the case of light load in which less than 10% of a rated current is used, a phenomenon in which a leading power factor (30° to 90°) is achieved because of excessive compensation for a power factor and thus active energy values are integrated in the [+] power reception direction occurs. In this case, a criterion for distinguishing this case from a normal case should be applied. That is, if the active energy value is measured in a [−] power transmission direction when a current RMS value (a load current) for any specific period is 10% or more of a rated current, it is determined that a connection error has occurred. Additionally, it is difficult for a situation in which a leading power factor is achieved when a load current uses 10% or more of a rated current to occur in practice, and this situation is determined to require the urgent improvement of customer equipment.

As described above, in this embodiment of the present invention, a phase angle is not calculated, unlike the conventional technology, and it is possible to determine a connection error for each rating in a smart meter by determining whether a voltage RMS value, a current RMS value, an active energy value, and/or a reactive energy value calculated for each phase meets the connection error detection criterion.

Figure 8:
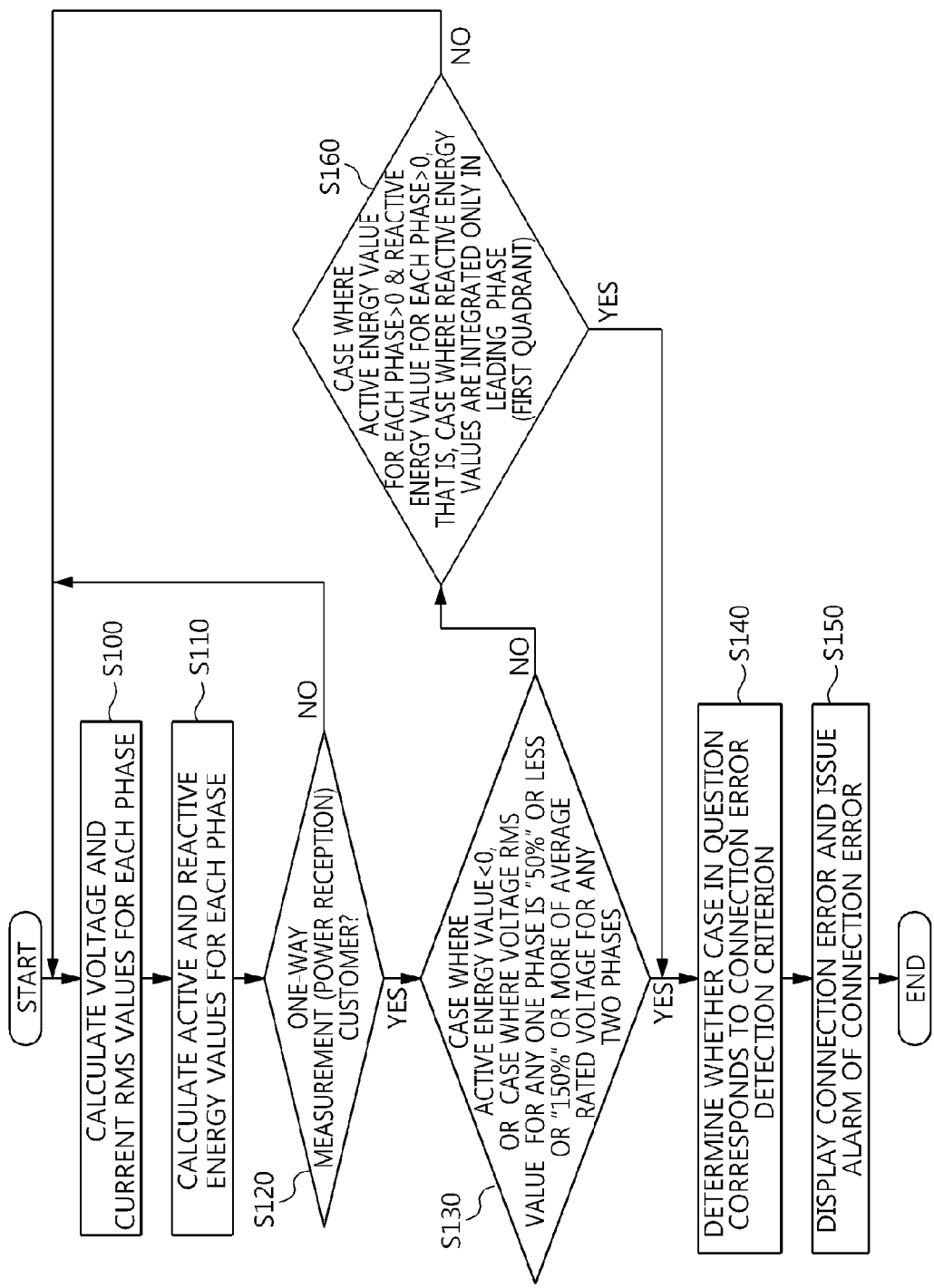
FIG. 8 is a flowchart illustrating a method of determining a connection error in a three-phase four-wire smart meter having no capacitor according to an embodiment of the present invention.

FIG. 8 is a flowchart illustrating a method of determining a connection error in a three-phase four-wire smart meter having no capacitor according to an embodiment of the present invention. In FIG. 8 based on this embodiment of the present invention, it is assumed that a customer in question is a one-way measurement customer who merely receives power.

As illustrated in FIG. 8, the parameter calculation unit 140 of the connection error detection device 100 according to this embodiment of the present invention receives voltage and current values for respective phases, converted into digital signals, from the converter 130. The parameter calculation unit 140 calculates voltage RMS values for voltage values for respective phases, and calculates current RMS values for current values for respective phases at step S100. Furthermore, the parameter calculation unit 140 calculates active energy values in power transmission and reception directions using the voltage RMS values and the current RMS values for respective phases. The parameter calculation unit 140 calculates lagging and leading reactive energy values in power transmission and reception directions based on the calculated active energy values at step S110. The parameter calculation unit 140 transfers connection error detection parameters including the voltage RMS values, the current RMS values, the active energy values and the reactive energy values for the voltage values for respective phases to the connection error determination unit 150.

The connection error determination unit 150 determines whether a customer is a one-way measurement customer at step S120.

If, as a result of the determination at step S120, the customer is a one-way measurement customer, the connection error determination unit 150 determines whether a case where an active energy value for each phase, which belongs to the connection error detection parameters, is smaller than "0" (in a single phase or three or more phases), or a case where an open-phase voltage situation in which a voltage RMS value for any one phase is "150%" or more or "50%" or less of an average rated voltage for any two phases has occurred (in three or more phases) is met at step S130. Meanwhile, if, as a result of the determination at step S120, the customer is not a one-way measurement customer, the process returns to step S100 and then perform its following steps.

If, as a result of the determination at step S130, a case where an active energy value for each phase is smaller than "0," or a case where an open-phase voltage situation in which a voltage RMS value for any one phase is "150%" or more or "50%" or less of an average rated voltage for any two phases has occurred is met, the connection error determination unit 150 determines that the connection error detection parameter meets the connection error detection criterion, and generates a connection error indication message indicative of the detection of a connection error and then transfers the connection error indication message to the display unit 160, and the connection error determination unit 150 generates a connection error alarm message and then transfers the connection error alarm message to the alarm unit 170 at steps S140 and S150.

Meanwhile, if, as a result of the determination at step S130, a case where an active energy value for each phase is smaller than "0," or a case where an open-phase voltage situation in which a voltage RMS value for any one phase is "150%" or more or "50%" or less of an average rated voltage for any two phases has occurred is not met, the connection error determination unit 150 determines whether an active energy value for each phase, which belong to the connection error detection parameters, is larger than "0" and a reactive energy value is larger than "0," that is, whether reactive energy values are integrated in a leading phase (a first quadrant) at step S160.

If, as a result of the determination at step S160, the active energy value for each phase, which belong to the connection error detection parameters, is larger than "0" and the reactive energy value is not larger than "0," the connection error determination unit 150 returns to step S100 and then performs its following steps. If, as a result of the determination at step S160, the active energy value for each phase is larger than "0" and the reactive energy value is larger than "0," the connection error determination unit 150 determines that the connection error detection criterion is met, and then performs steps S140 and S150.

Figure 9:
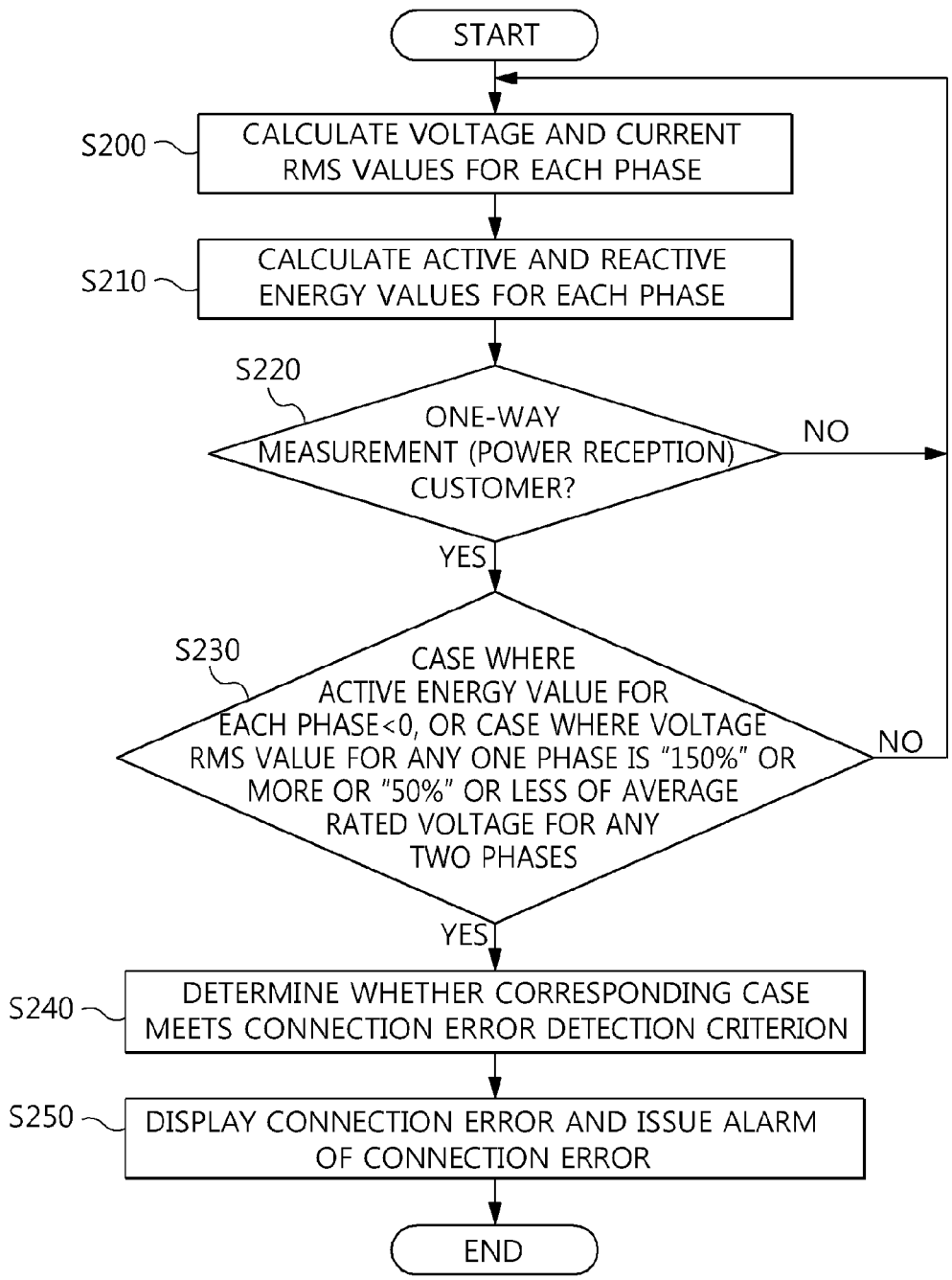
FIG. 9 is a flowchart illustrating a method of determining a connection error in a three-phase four-wire smart meter having a capacitor according to an embodiment of the present invention.

FIG. 9 is a flowchart illustrating a method of determining a connection error in a three-phase four-wire smart meter having a capacitor according to an embodiment of the present invention. In FIG. 9 based on this embodiment of the present invention, it is assumed that a customer in question is a one-way measurement customer who merely receives power.

Since the method (steps S200 to S250) of determining a connection error in a three-phase four-wire smart meter having a capacitor in order to compensate for a power factor according to this embodiment of the present invention, which is illustrated in FIG. 9, is the same as the method (steps S100 to S160) of determining a connection error in a three-phase four-wire smart meter having no capacitor, which is illustrated in FIG. 8, except that only "step S160" is omitted, a detailed description thereof will be omitted.

Although in the embodiments of the present invention, the methods of detecting a connection error in the case of a one-way measurement customer who merely receives power have been described, as illustrated in FIGS. 8 and 9, it is possible to detect a connection error in the case of a one-way measurement customer who merely transmits power when the same methods are performed in opposite manners.

More specifically, in the case of a smart meter having no capacitor, referring to FIG. 8, it is determined whether a customer in question is a one-way measurement customer in a manner opposite to that of step S120. Thereafter, a connection error is detected by determining whether a case where an active energy value for each phase, which belongs to the connection error detection parameters, is larger than "0" (in a single phase or three or more phases), or a case where an open-phase voltage situation in which a voltage RMS value for any one phase is "150%" or more or "50%" or less of an average rated voltage for any two phases has occurred (in three or more phases) is met in a manner opposite to that of step S130.

Meanwhile, if the above-described criterion opposite to that of step S130 is not met, a connection error is detected by determining whether an active energy value for each phase, which belong to the connection error detection parameters, is smaller than "0" and a reactive energy value is smaller than "0," that is, whether reactive energy values are integrated in a leading phase (a third quadrant).

In the meantime, in the case of a smart meter having a capacitor in order to compensate for a power factor, referring to FIG. 9, it is determined whether a customer in question is a one-way measurement customer in a manner opposite to that of step S220. Thereafter, a connection error is detected by determining whether a case where an active energy value for each phase, which belongs to the connection error detection parameters, is larger than "0" (in a single phase or three or more phases), which is an criterion opposite to that of step S230, or a case where an open-phase voltage situation in which a voltage RMS value for any one phase is "150%" or more or "50%" or less of an average rated voltage for any two phases has occurred (in three or more phases) is met.

The criterion that determines whether a voltage RMS value for any one phase is "150%" or more or "50%" or less of an average rated voltage for any two phases has occurred (in three or more phases) according to an embodiment of the present invention, that is, the criterion that detects a connection error using a voltage RMS value, is applied to a power reception customer, a power transmission customer and a two-way measurement customer in the same manner.

As described above, in the process of detecting a connection error for a one-way measurement customer who merely receives or transmits power, a connection error is detected for a two-way measurement customer, so that a connection error for a two-way measurement customer is also detected naturally.

As described above, the embodiments of the present invention are configured to detect a connection error, which may occur in various manners, for each rated smart meter, such as a single-phase two-wire smart meter or a three-phase four-wire smart meter (having a capacitor or no capacitor), using a voltage RMS value, a current RMS value, an active energy value and a reactive energy value for each phase, which are basically calculated in a smart meter. As a result, a conventional phase angle calculation algorithm and related hardware configuration required to calculate a phase angle and detect a connection error may be omitted, and accordingly the cost required to detect a connection error may be reduced.

Furthermore, the embodiments of the present invention are configured to prevent the error of a worker when a smart meter is connected and rapidly deal with a connection error or failure when the connection error or failure occurs. As a result, complaints attributable to erroneous measurement or zero measurement may be prevented from occurring, and the manpower and business of employees may be prevented from being unnecessarily consumed because of power charge disputes. Furthermore, the problem in which appropriate power charges are not received when the power charges are calculated based on power charge agreement may be improved.

As described above, the preferred embodiments have been described in the drawings and the specification. While specific terms have been used, they have been used merely for the purpose of illustrating the present invention, and are not intended to limit their meanings or the scope of the present invention described in the claims. Therefore, it will be understood by those having ordinary knowledge in the art that various modifications and other equivalent embodiments are possible from the drawings and the specification. Accordingly, the true range of the technical protection of the present invention should be defined by the technical spirit of the attached claims.

The invention claimed is:

1. A connection error detection device for detecting a connection error for each rating in a smart meter, comprising:
   a parameter calculation unit configured to calculate connection error detection parameters including voltage root-mean-square (RMS) values, current RMS values, active energy values and reactive energy values for three phases; and
   a connection error determination unit configured to set a connection error detection criterion for detecting a connection error for each rating in the smart meter, and to detect the connection error for each rating by determining whether any one of the connection error detection parameters meets the connection error detection criterion,
   wherein the connection error detection criterion is set to any one of a case where active energy values for any one or more phases are measured in a negative direction, a case where a voltage RMS value for any one phase is a first percentage or less or a second percentage or more of an average rated voltage for remaining two phases, the second percentage being higher than the first percentage, and a case where active and reactive energy values for any one or more phases are all measured in a positive direction.

2. The connection error detection device of claim 1, wherein the connection error determination unit, for a single-phase two-wire smart meter,
   sets any one of a case where the active energy values for any one or more phases are measured in a negative direction, and a case where the voltage RMS value is zero or the first percentage or less as the connection error detection criterion.

3. The connection error detection device of claim 1, wherein the connection error determination unit, for a three-phase four-wire smart meter having no capacitor, sets any one of a case where the active energy values for any one or more phases are measured in a negative direction, a case where the voltage RMS value for any one phase is the first percentage or less or the second percentage or more of the average rated voltage for the two phases, and a case where the active and reactive energy values for any one or more phases are all measured in a positive direction as the connection error detection criterion.

4. The connection error detection device of claim 1, wherein the connection error determination unit, for a three-phase four-wire smart meter having a capacitor, sets any one of a case where the active energy values for any one or more phases are measured in a negative direction, and a case where the voltage RMS value for any one phase is the first percentage or less or the second percentage or more of the average rated voltage for the two phases as the connection error detection criterion.

5. The connection error detection device of claim 1, wherein if phase differences between voltage and current for any one or more phases are 120°, 180° or 240°, the active energy values are measured in a negative direction.

6. The connection error detection device of claim 5, wherein:
   if the phase differences between voltage and current for any one or more phases are 240° or more because of a connection error, the reactive energy values are always integrated in a positive direction, and
   the connection error determination unit, in order to detect a connection error if the phase differences between voltage and current are 240° or more, sets the reactive energy values integrated in the positive direction as the connection error detection criterion.

7. The connection error detection device of claim 1, wherein the connection error determination unit, if phase voltages for any one or more phases are generated as a line voltage that is not a first voltage and is a second voltage higher than the first voltage, sets the line voltage as the connection error detection criterion.

8. The connection error detection device of claim 5, wherein the connection error determination unit, in order to detect a connection error in a case where although the connection error would be detected because a phase difference between voltage and current for any one phase is 120° because of the connection error, the active energy value is normally measured in a positive direction because of excessive compensation for a power factor, sets a case where the current RMS value is 10% or more of a rated current and the active energy values are measured in a negative direction as the connection error detection criterion.

9. The connection error detection device of claim 1, wherein the first percentage is 50%, and the second percentage is 150%.

10. The connection error detection device of claim 1, further comprising:
    a voltage measurement unit configured to measure the voltage values for three phases;
    a current measurement unit configured to measure the current values for three phases;
    a display unit configured to receive a connection error indication message from the connection error determination unit, and to display the connection error; and
    an alarm unit configured to receive a connection error alarm message from the connection error determination unit, and to provide notification of occurrence of the connection error.

11. The connection error detection device of claim 10, wherein the parameter calculation unit calculates a voltage RMS value for the voltage value for each of the phases, and calculates a current RMS value for the current value for each of the phases.

12. A connection error detection method for detecting a connection error for each rating in a smart meter using a connection error detection device, the connection error detection device including a voltage measurement unit configured to measure voltage values for three phases, a current measurement unit configured to measure current values for three phases, a parameter calculation unit configured to calculate parameters used to detect a connection error in a smart meter, and a connection error determination unit configured to detect the connection error using the parameters, the method comprising:
    receiving, by the parameter calculation unit, the voltage and current values for three-phase from the voltage and current measurement units, and calculating, by the parameter calculation unit, a voltage RMS value and a current RMS value for each of the phases;
    calculating, by the parameter calculation unit, an active energy value and a reactive energy value using the voltage and current RMS values for each of the phases;
    setting, by the connection error determination unit, a criterion for detecting the connection error for each rating in the smart meter to any one of a case where active energy values for any one or more phases are measured in a negative direction, a case where a voltage RMS value for any one phase is a first percentage or less or a second percentage or more of an average rated voltage for remaining two phases, the second percentage being higher than the first percentage, and a case where active energy values and reactive energy values for any one or more phases are all measured in a positive direction; and detecting, by the connection error determination unit, the connection error for each rating by determining whether any one of the connection error detection parameters meets the connection error detection criterion.

13. The connection error detection method of claim 12, wherein setting the criterion as any one of the cases comprises:

if the smart meter is the a single-phase two-wire smart meter, setting, by the connection error determination unit, a case where the active energy values for any one or more phases are measured in a negative direction, as the connection error detection criterion; and setting, by the connection error determination unit, a case where the voltage RMS value is zero or the first percentage or less as the connection error detection criterion.

14. The connection error detection method of claim 12, wherein setting the criterion as any one of the cases comprises:

if the smart meter is a three-phase four-wire smart meter having no capacitor, setting, by the connection error determination unit, a case where the active energy values for any one or more phases are measured in a negative direction as the connection error detection criterion;

setting, by the connection error determination unit, a case where the voltage RMS value for any one phase is the first percentage or less or the second percentage or more of the average rated voltage for the two phases as the connection error detection criterion; and setting, by the connection error determination unit, a case where the active and reactive energy values for any one or more phases are all measured in a positive direction as the connection error detection criterion.

15. The connection error detection method of claim 12, wherein setting the criterion as any one of the cases comprises:

if the smart meter is a three-phase four-wire smart meter having a capacitor, setting, by the connection error determination unit, a case where the active energy values for any one or more phases are measured in a negative direction as the connection error detection criterion; and setting, by the connection error determination unit, a case where the voltage RMS value for any one phase is the first percentage or less or the second percentage or more of the average rated voltage for the two phases as the connection error detection criterion.

16. The connection error detection method of claim 12, wherein if phase differences between voltage and current for any one or more phases are 120°, 180° or 240°, the active energy values are measured in a negative direction.

17. The connection error detection method of claim 16, wherein setting the criterion as any one of the cases comprises, in order to detect a connection error if the phase differences between voltage and current for any one or more phases are 240° or more, setting, by the connection error determination unit, the reactive energy values integrated in the positive direction as the connection error detection criterion.

18. The connection error detection method of claim 12, wherein setting the criterion as any one of the cases comprises:

determining, by the connection error determination unit, whether phase voltages for any one or more phases are generated as a line voltage that is not a first voltage and is a second voltage higher than the first voltage; and setting, by the connection error determination unit, the line voltage as the connection error detection criterion.

19. The connection error detection method of claim 16, wherein setting the criterion as any one of the cases comprises, in order to detect a connection error in a case where although the connection error would be detected because a phase difference between voltage and current for any one phase is 120° because of the connection error, the active energy value is normally measured in a positive direction because of excessive compensation for a power factor, setting, by the connection error determination unit, a case where the current RMS value is 10% or more of a rated current and the active energy values are measured in a negative direction as the connection error detection criterion.

20. The connection error detection method of claim 12, further comprising:

displaying the detected connection error for each rating via a display unit of the connection error detection device; and providing notification that the detected connection error for each rating has occurred via an alarm unit of the connection error detection device.

* * * * *